(12) United States Patent
Bacino

(10) Patent No.: US 10,434,742 B2
(45) Date of Patent: Oct. 8, 2019

(54) VENTING APPARATUS

(71) Applicant: W. L. Gore & Associates, Inc., Newark, DE (US)

(72) Inventor: John E. Bacino, Landenberg, PA (US)

(73) Assignee: W. L. Gore & Associates, Inc., Newark, DE (US)

(*) Notice: Subject to any disclaimer, the term of this patent is extended or adjusted under 35 U.S.C. 154(b) by 600 days.

(21) Appl. No.: 15/042,529

(22) Filed: Feb. 12, 2016

(65) Prior Publication Data

US 2016/0236440 A1 Aug. 18, 2016

Related U.S. Application Data

(60) Provisional application No. 62/115,789, filed on Feb. 13, 2015.

(51) Int. Cl.
 *B32B 3/24* (2006.01)
 *B32B 3/26* (2006.01)
 (Continued)

(52) U.S. Cl.
 CPC ............ *B32B 3/266* (2013.01); *B01D 65/003* (2013.01); *B29C 65/4815* (2013.01); *B29C 66/1122* (2013.01); *B29C 66/472* (2013.01); *B29C 66/5346* (2013.01); *B29C 66/61* (2013.01); *B29C 66/727* (2013.01); *B29C 66/7392* (2013.01); *B29C 66/81429* (2013.01); *B29C 66/8322* (2013.01); *B32B 7/12* (2013.01); *B32B 27/322* (2013.01); *B32B 37/1207* (2013.01); *H05K 5/0213* (2013.01); *B01D 63/087* (2013.01); *B01D 69/06* (2013.01); *B01D 71/36* (2013.01); *B01D 2313/16* (2013.01); *B29C 66/71* (2013.01); *B29C 66/712* (2013.01); *B29C 66/723* (2013.01); *B29C 66/73921* (2013.01); *B29C 66/742* (2013.01);
 (Continued)

(58) Field of Classification Search
 CPC ......................... B32B 3/266; Y10T 428/24331
 See application file for complete search history.

(56) References Cited

U.S. PATENT DOCUMENTS

| 5,171,439 A | 12/1992 | Vakharia |
| 2005/0247105 A1* | 11/2005 | Dikken ............... B01D 39/1692 73/28.04 |

(Continued)

FOREIGN PATENT DOCUMENTS

| EP | 1 313 359 A2 | 5/2003 |
| EP | 2 202 117 A1 | 6/2010 |

(Continued)

OTHER PUBLICATIONS

International Search Report and Written Opinion for PCT/US2016/017727 dated May 18, 2016.

*Primary Examiner* — William P Watkins, III
(74) *Attorney, Agent, or Firm* — Greenberg Traurig, LLP

(57) ABSTRACT

A venting apparatus is disclosed herein. The venting apparatus comprises a substrate, such as a metal substrate or a specialty plastic substrate, having an opening therein and a fluoropolymer membrane, such as ePTFE, disposed over said opening and thermally bonded using a thermoplastic material to said substrate. This allows the fluoropolymer membrane to be directly bonded to the said substrate without using an adhesive layer.

10 Claims, 3 Drawing Sheets

(51) Int. Cl.
  B01D 65/00      (2006.01)
  H05K 5/02       (2006.01)
  B29C 65/48      (2006.01)
  B29C 65/00      (2006.01)
  B32B 7/12       (2006.01)
  B32B 27/32      (2006.01)
  B32B 37/12      (2006.01)
  B01D 69/06      (2006.01)
  B01D 71/36      (2006.01)
  B29K 627/12     (2006.01)
  B29K 627/18     (2006.01)
  B29L 31/00      (2006.01)
  B01D 63/08      (2006.01)

(52) U.S. Cl.
  CPC .......... *B29C 66/919* (2013.01); *B29C 66/929* (2013.01); *B29C 66/949* (2013.01); *B29K 2627/12* (2013.01); *B29K 2627/18* (2013.01); *B29L 2031/755* (2013.01); *B32B 2037/1223* (2013.01); *B32B 2307/724* (2013.01); *B32B 2309/02* (2013.01); *B32B 2309/04* (2013.01); *B32B 2327/12* (2013.01); *B32B 2327/18* (2013.01); *B32B 2435/02* (2013.01); *Y10T 428/24331* (2015.01)

(56) References Cited

U.S. PATENT DOCUMENTS

2010/0221995 A1*  9/2010  Furuyama ............... B29C 65/08
                                                            454/284
2010/0227543 A1   9/2010  Furuyama

FOREIGN PATENT DOCUMENTS

| EP | 2 881 427 A1    | 6/2015  |
|----|-----------------|---------|
| WO | WO 98/13273 A1  | 4/1998  |
| WO | WO 2013/183211 A1 | 12/2013 |
| WO | WO 2014/020882 A1 | 2/2014  |

* cited by examiner

VENTING APPARATUS

CROSS-REFERENCES TO RELATED APPLICATIONS

This patent application claims priority from U.S. Provisional Application Ser. No. 62/115,789, entitled "Venting Apparatus," filed Feb. 13, 2015, the disclosure of which is incorporated herein by reference in its entirety.

FIELD OF INVENTION

This disclosure is directed to a venting apparatus having a fluoropolymer membrane bonded to a substrate, and more particularly to a venting apparatus having an expanded polytetrafluoroethylene (PTFE) membrane securely bonded to a substrate that can withstand high temperatures such as 150° C. and above.

BACKGROUND

Vents find use in many applications. For example, in the automotive industry, electrical component housings, gear housings, brake housings and even vehicle bodies use vents to equalize pressure between the housing or body interior and the surrounding environment. In other applications, the function of the vent is not bulk flow for pressure equalization, but diffusion for the purpose of transporting select components across the media, such as the diffusion of water across a media for moisture control. In these types of applications the driving force is not pressure, but temperature, concentration gradients, osmotic pressure, electrostatic attraction or repulsion, or some other driving force. Vents are also used in many other applications, such as electrical and mechanical equipment housings or chemical containers. Such housings, enclosures or containers are collectively referred to herein as a "housing."

In many applications, vents must not only be gas permeable to allow for pressure equalization, but also be liquid impermeable to seal the interior of a housing from moisture, liquids or contaminants, which can damage internal equipment or components and corrode the housing.

Known adhesive vents contain a porous expanded PTFE (ePTFE) on a ring of a double sided pressure sensitive adhesive, one side of the adhesive is bonded to the ePTFE membrane and the other side to the housing.

Press fitted vents containing a molded polymer or plastic body and a porous membrane formed from polytetrafluoroethylene (PTFE), polypropylene or polyethylene are known. Known polymer vents are used as air vent devices in, for example, a breather valve, a filter, a diaphragm device, etc. Press-fitted vents typically include a membrane with circumferentially located holes that are positioned between rigid resin portions bound together through the circumferentially located holes. This rigid member is encompassed by a soft resin to form the press fitted article.

Many other configurations of molded polymer or plastic vents are known, however, all suffer significant shortcomings. Polymer or plastic vents and adhesive vents each lack durability as well as heat and chemical resistance. Accordingly, these vents cannot be used in certain applications where they may be subject to high temperatures (above 150° C.), ultraviolet ("UV") or chemical degradation or impact. A shortcoming of a press-fitted vent is that they do not have a low profile.

Metal vents are known to provide improved durability in some applications. Also, some special plastic materials like epoxies or other thermoset plastics may provide durability. An integral vent containing such metal or specialty plastic materials bonded to a porous ePTFE membrane is desirable, yet heretofore unachievable.

SUMMARY OF THE INVENTION

In one embodiment there is provided a venting apparatus comprising a substrate having an opening therein, and a fluoropolymer membrane disposed over said opening and thermally bonded using a thermoplastic material to said substrate. The fluoropolymer membrane is selected from the group consisting of polytetrafluoroethylene, fluorinated ethylenepropylene, and perfluoroalkoxy polymer. The thermoplastic material is selected from the group consisting of poly(ethylene-co-tetrafluoroethylene-co-hexafluoropropylene (EFEP), tetrafluoroethylene hexafluoropropylene vinylidene fluoride (THV), poly(tetrafluoroethylene-co-hexafluoropropylene) (FEP), perfluoroalkoxy (PFA), ethylene tetratfluorothethylene (ETFE), and blends of polyvinyl chloride (PVC) resins and nitrile rubber.

In another embodiment there is provided a venting apparatus comprising a metal substrate having an opening therein, and a fluoropolymer membrane disposed over said opening and thermally bonded using a thermoplastic material to said metal substrate. The metal substrate is selected from the group consisting of aluminum, carbon steel, and stainless steel. In one embodiment, there is provided an apparatus comprising a metal substrate having an opening therein and an ePTFE membrane disposed over said opening and thermally bonded using a thermoplastic material to said metal substrate.

In yet another embodiment there is provided a venting apparatus comprising a specialty plastic substrate having an opening therein, and a fluoropolymer membrane disposed over said opening and thermally bonded using a thermoplastic material to said specialty plastic substrate. The specialty plastic substrate is selected from the group consisting of glass filled polyphenylene sulfide (PPS); polybutylene terephthalate (PBT); polyether ether ketone (PEEK); polypthalamides (PPA); acetal homopolymers; polyethylene terephthalate (PET); thermoset epoxies; and thermoset elastomers. In an embodiment, there is provided an apparatus comprising a substrate comprising a specialty plastic having an opening therein; and an ePTFE membrane disposed over said opening and thermally bonded using a thermoplastic material to said specialty plastic.

In one embodiment there is provided a method of assembling a venting apparatus comprising providing a thermoplastic material between a fluoropolymer membrane and a substrate; and thermally bonding said fluoropolymer membrane to said substrate by heating said thermoplastic material at a temperature from 250° C. to 500° C.

DETAILED DESCRIPTION

Figure 1:
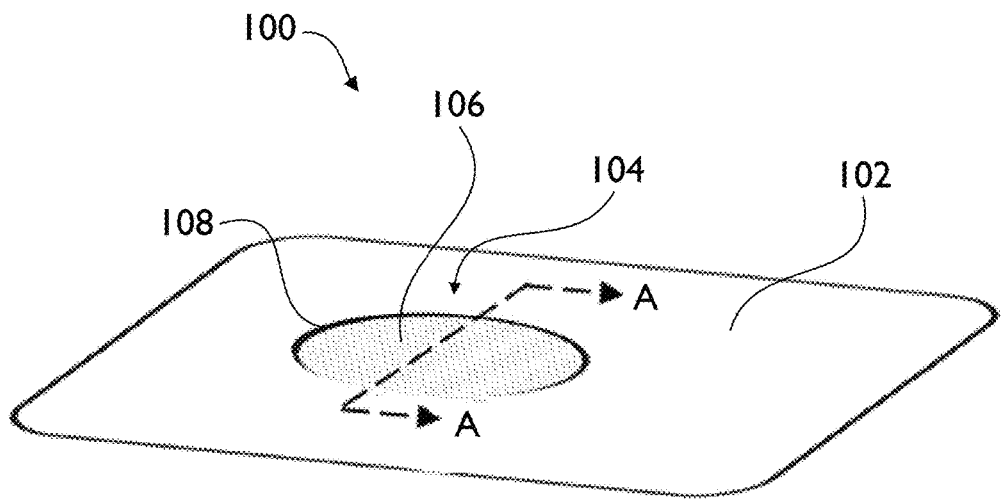
FIG. 1 is a perspective view of a venting apparatus in accordance with an embodiment of the disclosure.
Figure 2:
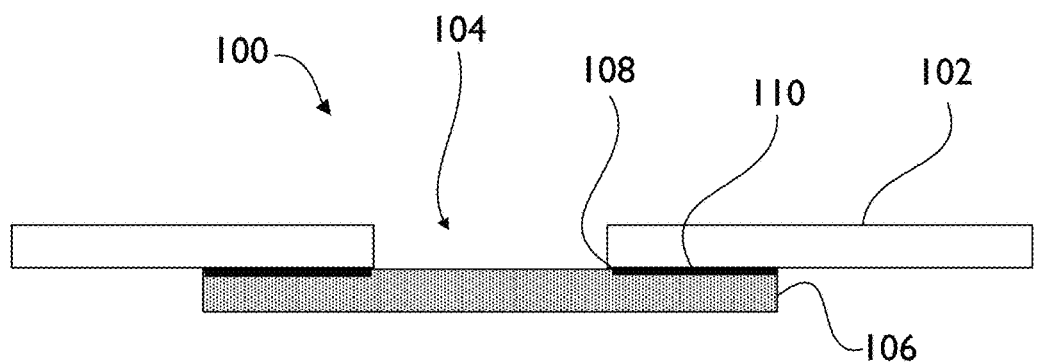
FIG. 2 is a sectional view of the venting apparatus of FIG. 1, taken along line A-A.

In one embodiment, the present disclosure provides a venting apparatus 100 shown in FIGS. 1 and 2. Venting apparatus 100 comprises a substrate 102 on to which a fluoropolymer membrane 106 may be bonded using a thermoplastic material 110 to cover at least one opening 104 in the substrate 102. As shown along the enclosed edge 108 of opening 104, fluoropolymer membrane 106 is flush against substrate 102. In addition, thermoplastic material 110 may be at least partially wetted into (i.e. fills the pores of) the fluoropolymer membrane 106 to provide a secure bond with substrate 102. Advantageously this secure bond allows venting apparatus to maintain a low profile and avoids bulky molded layers, tapes, or adhesive layers.

In one embodiment, the venting apparatus may be used in applications involving temperatures of 150° C. or above, such as from 150° C. to 300° C. The venting apparatus may be used in several different applications, including but not limited to motors, engines, automobile parts, sensors, medical devices, electronics, housings for electronic components or devices, or electronic control units. Automobile parts broadly applies to AC/heater components, braking systems, connectors, cylinder head covers, drive shafts, engine air cleaners, engine covers, engine mounts, engine throttle bodies, engine valve covers, exhaust systems, fan shrouds/radiators, fans, fuel pumps, fuse and injection systems, ignition components, intake manifolds, oil pans, oil pumps, other pumps, power train parts, radiator parts, reservoirs, rocker arm covers, switches and sockets, transmission components, underbody/heat shield, and water pumps.

Unless defined otherwise, all technical and scientific terms used herein have the same meaning as commonly understood by one of ordinary skill in the art to which the invention belongs. Although any methods and materials similar or equivalent to those described herein can be used in the practice or testing of the present invention, the preferred methods and materials are described herein.

The substrate is constructed of a durable material that is at least capable of withstanding high temperatures such as 150° C. and above without deformation. The substrate may take any shape or size and may be attached to a housing using adhesive or mechanical means. In an alternative embodiment, the substrate may be the housing. The substrate may have one or more openings and each opening may have a fluoropolymer membrane thermally bonded outside of the opening's perimeter as described herein. The size and shape of the opening may vary depending on the requirements for the particular application and suitable shapes include circles, ovals, squares, rectangles, diamonds, triangles, or any other shape. In addition, the size of the opening is not particularly limiting and may vary depending on the application. For purposes of illustration the opening may have a greatest diameter from 0.5 cm to 10 cm, from 1 cm to 5 cm. Other opening sizes may also be employed with the embodiments disclosed herein.

In one embodiment, the substrate may be a suitable heat and/or chemical resistant material such as a metal substrate. The metal substrate may be constructed of stainless steel, carbon steel, stamped metal, or aluminum. A suitable stainless steel substrate may be an iron alloy comprising nickel, chromium, vanadium, molybdenum or manganese and combinations thereof. A suitable carbon steel substrate may comprise iron and carbon. In one embodiment, there is provided a fluoropolymer membrane which is thermally bonded to a housing constructed of a metal substrate described above.

In yet another embodiment, the disclosure provides a substrate which is constructed of a specialty plastic substrate. The specialty plastic substrate may be a material such as glass filled polyphenylene sulfide (PPS); polybutylene terephthalate (PBT) (Ultradur™ HR PBT; BASF); polyether ether ketone (PEEK); polypthalamides (PPA) (Amodel™ PPA; Solvay); acetal homopolymers (Delrin™ DuPont); polyethylene terephthalate (PET) (Arinte™ A-X07455; DSM); thermoset epoxies such as carbon-fiber-reinforced thermoplastic; and thermoset elastomers such as ethylene propylene diene monomer (EPDM), nitrile rubber (NBR), silicone, and fluoroelastomers (Viton; DuPont). In one embodiment, the substrate is selected from the group consisting of PET, PBT, polypropylene, polyamides, phenolics, unsaturated polyesters, poly(p-phenylene oxide) (PPO)/polyamides, vinyl esters, polyacetals, PPO/HIPS (high-impact polystyrene), polyethylenimine (PEI), epoxies, high density polyethylene (HDPE), PPS, and polyvinyl chloride (PVC). In one embodiment, there is provided a fluoropolymer membrane which is thermally bonded to a substrate constructed of a specialty plastic material described above.

Another contemplated embodiment includes a vent comprising a substrate made of a specialty plastic to which an ePTFE membrane is thermally bonded using a thermoplastic material, and more particularly a thermoplastic fluoropolymer material.

The fluoropolymer membrane is disposed over the opening to protect the internals of the device from mechanical or environmental damage without impeding the function of the device. The fluoropolymer membrane should be sufficiently sized to completely cover the opening and extends pass the opening in each direction so that the fluoropolymer membrane may be thermally bonded to the substrate. In other words the greatest diameter of the fluoropolymer is at least larger than the greatest diameter of the opening in the substrate. The fluoropolymer membrane may be polytetrafluoroethylene (PTFE), fluorinated ethylenepropylene (FEP), or perfluoroalkoxy polymer (PFA). In one embodiment, the fluoropolymer membrane may be expanded PTFE (ePTFE) that may be uniaxially or biaxially expanded and made according to the teachings of U.S. Pat. No. 3,953,566, the entire content and disclosure of which is hereby incorporated by reference. Single layer or multilayer ePTFE membranes may be used. The ePTFE membrane may be optionally rendered oleophobic using known methods in the art. Examples of oleophobic coatings include for example, fluoropolymers such as fluoroacrylates and other materials such as those taught in U.S. Pub. No. 2007/0272606, the entire content and disclosure of which is incorporated by reference.

The fluoropolymer membrane can be made out of any fluoropolymer that can be expanded to make a porous and permeable article. Suitable materials include expandable fluoropolymers such as but not limited to expanded PTFE, and expanded products made with polymers as described in U.S. Pat. Nos. 5,708,044; 6,541,589; 7,531,611; 8,637,144; and 9,139,669, the entire contents and disclosures of which are hereby incorporated by reference.

The fluoropolymer membrane can be made to have properties specific for the application. The fluoropolymer membrane may be made to have a bubble point greater than 5 psi, greater than 25 psi greater than 50 psi, greater than 75 psi, greater than 100 psi, or between 5 psi and 150 psi. The fluoropolymer membrane layer can be made very thin, such as approximately 1 µm thick, or thick such as greater than 10 mm thick. To achieve a low profile for the venting apparatus, a thinner fluoropolymer membrane may be used. The fluoropolymer membrane layer can be made to have a wide range of permeability, or specific flow resistance as desired by the particular application.

Thermoplastic materials used to bond the fluoropolymer membrane to the substrate, either metal substrate or specialty plastic substrate, are high melt thermoplastics. In one embodiment, the thermoplastic material is a thermoplastic fluoropolymer material. Thermoplastic materials may include poly(ethylene-co-tetrafluoroethylene-co-hexafluoropropylene) (EFEP), tetrafluoroethylene hexafluoropropylene vinylidene fluoride (THV), poly(tetrafluoroethylene-co-hexafluoro-propylene) (FEP), perfluoroalkoxy (PFA), ethylene tetrafluoroethylene (ETFE), and blends of PVC resins and nitrile rubber (Elastamax™ HTE; PolyOne). In one embodiment, a colorant may be added to the thermoplastic material to indicate the thermal bond.

The thermoplastic material is sized to be positioned around the outside of the opening's perimeter. In one embodiment, the thermoplastic material also comprises an opening that is aligned with the opening of the substrate so as to avoid obstructing the fluoropolymer membrane. In one embodiment, the thermoplastic material may be a ring.

In one embodiment, a combination of thermoplastic materials may be used. For example, a first thermoplastic material may be used around a first portion and a second thermoplastic material may be used around a second portion. Additional thermoplastics materials may be used as needed for remaining portions to complete the perimeter around the opening in the substrate.

One advantage of using a thermoplastic material is that this allows the fluoropolymer membrane to be directly bonded to the substrate without using an adhesive layer. This may allow the venting apparatus to maintain a low profile. In addition, due to the absence of an adhesive layer, the venting apparatus may be used in high temperature applications and may be more resistant the ultraviolet or chemical degradation than adhesive layers.

A porous article having an ePTFE membrane with a coherent irregular network of the thermoplastic materials may also be used. Such an article is described in U.S. Pat. No. 8,808,848, the entire contents and disclosures of which is hereby incorporated by reference.

In one embodiment, the fluoropolymer vent may be thermally bonded to the substrate. Thermal bonding may include several welding methods such as heat welding, laser welding, ultrasonic welding or impulse welding. One advantage of an embodiment described herein is the welding may be performed in a reasonable amount of time, such as not greater than 15 seconds or from 5 to 15 second, or from 10 to 15 seconds. In one embodiment, the bonding temperature for the welding may range from 250° C. to 500° C., from 275° C. to 400° C. or from 360° C. to 390° C.

In another embodiment, the disclosure provides an ePTFE membrane which is thermally bonded directly to a housing using a thermoplastic material. The housing may be constructed of a metal substrate such as aluminum or carbon steel or stainless steel.

The details of one or more embodiments are set forth in the description herein. Other features, objects, and advantages will be apparent from the description and from the claims. The examples below are intended to further illustrate certain aspects of the methods and compositions described herein, and are not intended to limit the scope of the claims.

Example 1

Figure 3:
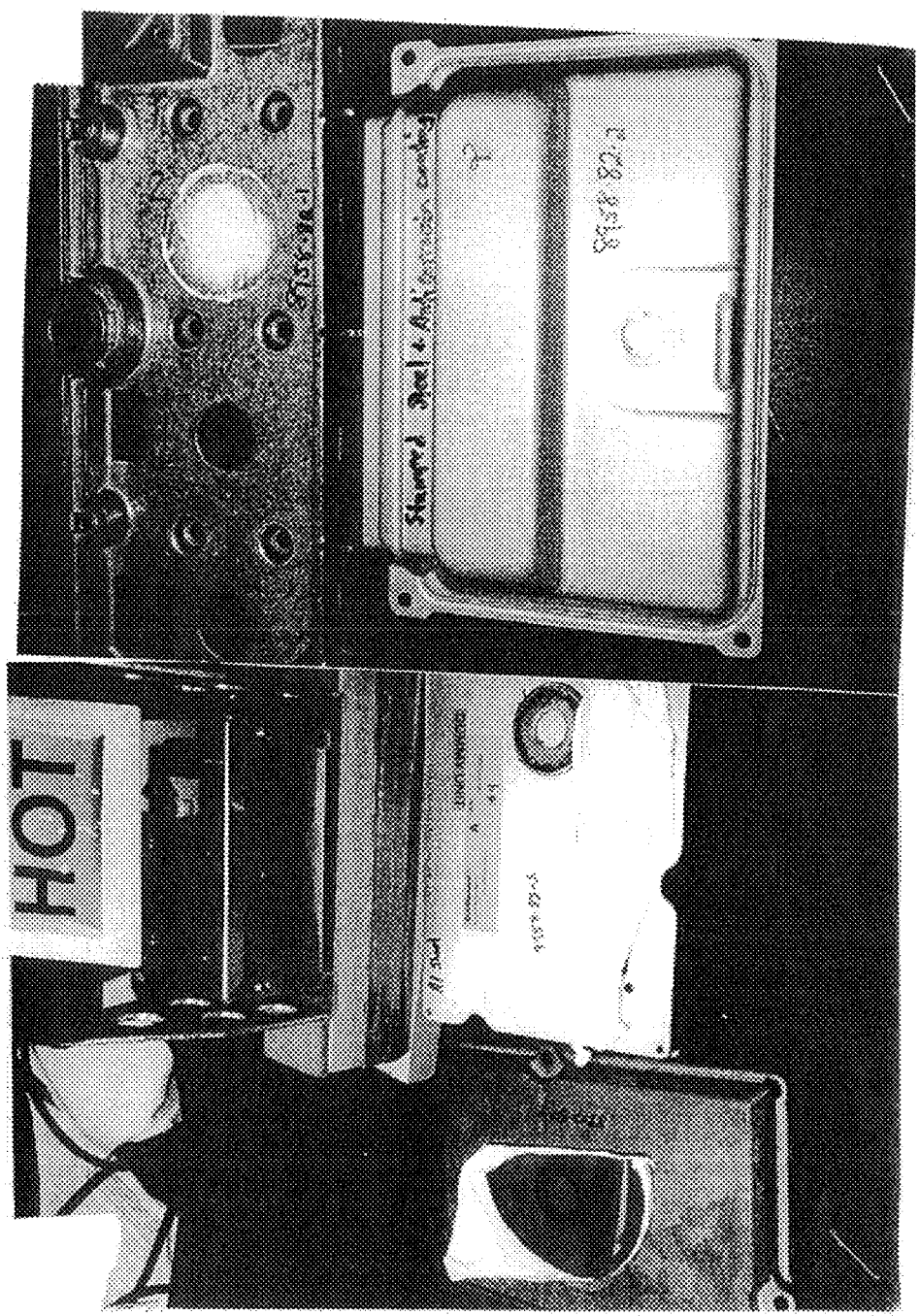
FIG. 3 shows an image of an embodiment of the disclosure.

A ring of EFEP (½ mil thickness, 1 inch inner diameter) was placed over an opening (about 1 inch in diameter) in an aluminum casting. An ePTFE membrane was then placed over the EFEP ring. A metal washer about the size of the ring of EFEP was placed over the ePTFE membrane. A metal clamp was used to clamp down the casting, FEP ring, ePTFE membrane and the metal washer and then placed in an oven at 275° C. for 20 mins. The resulting structure is shown in FIG. 3. The ePTFE membrane was well bonded around the edges of the opening. It appeared that the EFEP wetted into the ePTFE structure. The edges appeared very clear. The ePTFE membrane was bonded flush to the aluminum casting, thereby resulting in a low profile or thin form factor venting apparatus.

Example 2

Figure 4:
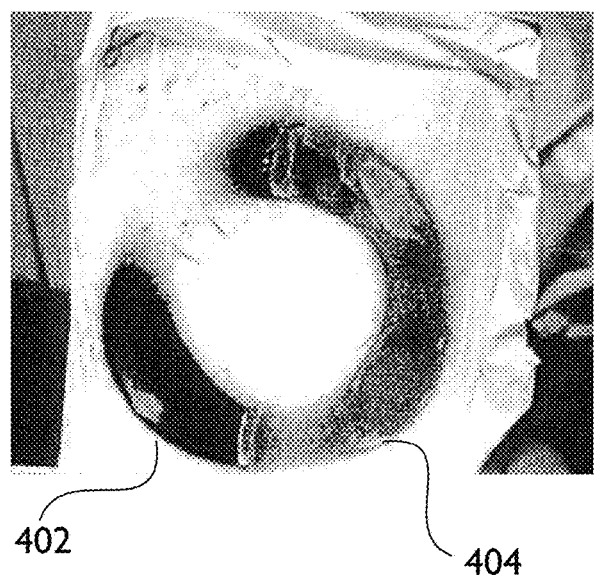
FIG. 4 shows an image of another embodiment of the disclosure.

A ring of a first thermoplastic (FEP black in color, ½ mil thickness, 1 inch inner diameter) was cut in half, one half of the ring 402 was placed over an opening (about 1 inch in diameter) in an aluminum casting. A ring of a second thermoplastic (THV blue in color, ½ mil thickness, 1 inch inner diameter) was cut in half, one half of the ring 404 was placed adjacent the above black FEP ring 402. These two halves of the two thermoplastic materials together created a ring around the opening. An ePTFE membrane was then placed over these two half rings and a Kapton release film. A metal washer about the size of the full ring was placed over the Kapton release film. A metal clamp was used to clamp down the casting, FEP/THV halves, ePTFE membrane and the metal washer and then placed in an oven at 325° C. for 20 mins. This resulting structure is shown in FIG. 4. The ePTFE membrane appeared to be well-bonded around the edges of the opening. It appeared that the FEP and THV wetted into the ePTFE structure. The THV and FEP edges appeared blue and black respectively. This example illustrates that color may be used as an indicator of weld quality.

Example 3

Figure 5:
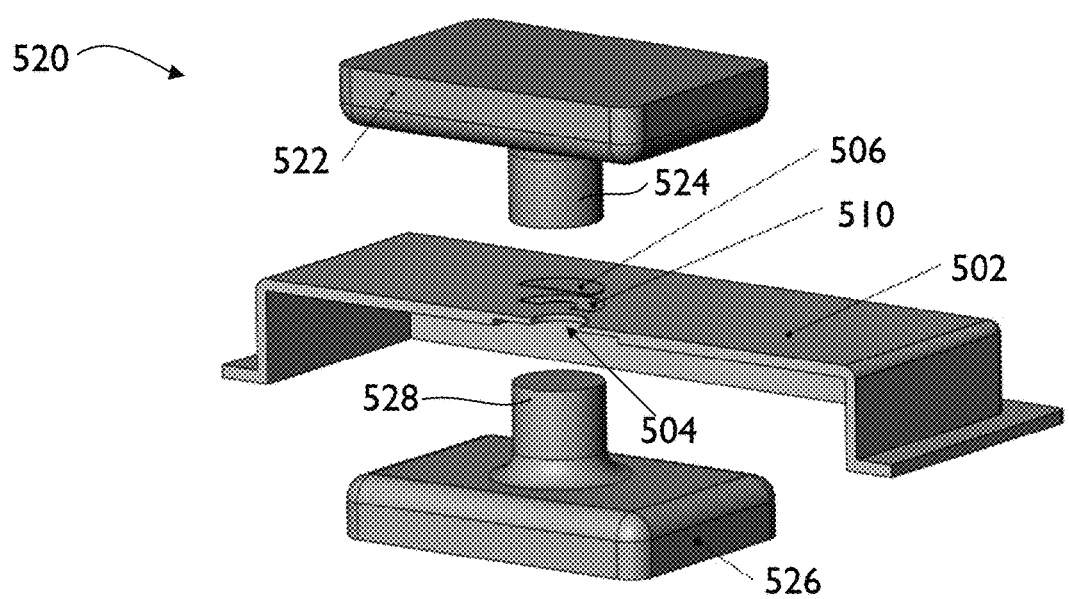
FIG. 5 is a perspective side view of a device used to make an exemplary embodiment of the disclosure.

A ring of THV 510 (2 mil thickness, ¾ inch outer diameter, ¼ inch inner diameter) was placed over an opening 504 (⅛ inch diameter) in an aluminum casting 502. A uniaxially expanded ePTFE membrane 506 was then placed over the THV ring 510. The above construction was welded together from both the top and bottom sides using a heat welder 520 as shown in FIG. 5. Heat welder 520 comprises a first welding source 522 having a first weld tip 524 that welds from the top side and a second welding source 526 having a second weld tip 528 that welds from the bottom side.

The welding conditions are as follows: Dwell Time: 10 secs, Temperature of the bottom tip: 390° C., Temperature of the top tip: 120° C., Load at Weld Area: 1392 psi. The resulting weld was about 0.1 inches in width.

The ePTFE membrane was well bonded to the metal around the opening. The Water Entry Pressure (WEP) was measured to be 22 psi. The Burst pressure was measured to be greater than 40 psi which is at least about 2 times greater than the WEP, thereby indicating a good seal in the weld area. The ePTFE membrane was bonded flush to the aluminum casting, thereby resulting in a low profile or thin form factor venting apparatus.

Water Entry Pressure

This is a test method for measuring water intrusion through a membrane. The venting apparatus (ePTFE membrane on the metal surface) was clamped between a pair of fixtures. The lower fixture had the ability to pressurize a section of the sample with water. The sample was pressurized in small increments of pressure until water breakthrough was observed through the sample. The corresponding breakthrough pressure or entry pressure was recorded as water entry pressure.

Burst Pressure

The venting apparatus (ePTFE membrane on the metal surface) was pressurized using water from the bottom or the metal side to a pressure greater than the Water Entry Pressure of the membrane. The pressure ramp was up to at least about 2 times the Water Entry Pressure. If no water leakage is observed around the weld area under this condition, it was recorded as indicative of a good seal in the weld area.

What is claimed is:

1. An apparatus comprising:
   (a) a substrate having an opening therein;
   (b) a fluoropolymer membrane disposed over said opening; and
   (c) a thermoplastic material provided between said fluoropolymer membrane and said substrate;
   wherein the substrate comprises a plastic material selected from the group consisting of glass filled polyphenylene sulfide (PPS); polypthalamides (PPA); acetal homopolymers; thermoset epoxies; and combinations thereof; and
   wherein the fluoropolymer membrane is thermally bonded to the substrate by the thermoplastic material.

2. The apparatus as defined in claim 1, wherein said fluoropolymer membrane is selected from the group consisting of polytetrafluoroethylene, fluorinated ethylenepropylene, and perfluoroalkoxy polymer.

3. The apparatus as defined in claim 1, wherein said fluoropolymer membrane is expanded polytetrafluoroethylene.

4. The apparatus as defined in claim 1, wherein said apparatus does not comprise an adhesive layer between said substrate and said fluoropolymer membrane.

5. The apparatus as defined in claim 1, wherein said thermoplastic material is selected from the group consisting of poly(ethylene-co-tetrafluoroethylene-co-hexafluoropropylene (EFEP), tetrafluoroethylene hexafluoropropylene vinylidene fluoride (THV), poly(tetrafluoroethylene-co-hexafluoro-propylene) (FEP), perfluoroalkoxy (PFA), ethylene tetratfluorothethylene (ETFE), and blends of polyvinyl chloride (PVC) resins and nitrile rubber.

6. The apparatus as defined in claim 1, wherein said thermoplastic material is at least partially wetted into said fluoropolymer membrane.

7. The apparatus as defined in claim 1, wherein said thermoplastic material comprises a colorant.

8. The apparatus as defined in claim 1, wherein said thermoplastic material comprises an opening that is aligned with the opening of the substrate.

9. A method of assembling a venting apparatus comprising:
   providing a thermoplastic material between a fluoropolymer membrane and a substrate having an opening therein; and
   thermally bonding said fluoropolymer membrane to said substrate by heating said thermoplastic material at a temperature from 250° C. to 500° C.
   wherein the substrate comprises a plastic material selected from the group consisting of glass filled polyphenylene sulfide (PPS); polypthalamides (PPA); acetal homopolymers; thermoset epoxies; and combinations thereof.

10. The method as defined in claim 9, wherein the thermally bonding step is not greater than 15 seconds.

* * * * *